(12) United States Patent
Chan et al.

(10) Patent No.: US 9,543,452 B1
(45) Date of Patent: Jan. 10, 2017

(54) HIGH VOLTAGE JUNCTION FIELD EFFECT TRANSISTOR

(71) Applicant: MACRONIX International Co., Ltd., Hsinchu (TW)

(72) Inventors: Wing-Chor Chan, Hsinchu (TW); Hsing-Chih Wu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/789,478

(22) Filed: Jul. 1, 2015

(51) Int. Cl.
*H01L 29/66* (2006.01)
*H01L 29/808* (2006.01)
*H01L 29/10* (2006.01)
*H01L 29/06* (2006.01)
*H01L 29/78* (2006.01)

(52) U.S. Cl.
CPC .......... *H01L 29/808* (2013.01); *H01L 29/063* (2013.01); *H01L 29/0634* (2013.01); *H01L 29/0649* (2013.01); *H01L 29/1095* (2013.01); *H01L 29/66893* (2013.01); *H01L 29/66901* (2013.01); *H01L 29/7832* (2013.01)

(58) Field of Classification Search
None
See application file for complete search history.

(56) References Cited

U.S. PATENT DOCUMENTS

| | | | |
|---|---|---|---|
| 9,190,536 B1 * | 11/2015 | Chan | H01L 29/808 |
| 2012/0001240 A1 | 1/2012 | Yu | |
| 2012/0104492 A1 * | 5/2012 | Chu | H01L 29/0634 257/335 |
| 2012/0142149 A1 | 6/2012 | Tsuchiko | |
| 2013/0265102 A1 | 10/2013 | Lin et al. | |
| 2013/0313617 A1 | 11/2013 | Yeh et al. | |
| 2014/0055901 A1 | 2/2014 | Sung et al. | |
| 2015/0137192 A1 * | 5/2015 | Han | H01L 29/402 257/285 |
| 2015/0325694 A1 * | 11/2015 | Chan | H01L 29/66681 327/434 |

FOREIGN PATENT DOCUMENTS

| TW | 201304370 | 1/2013 |
|---|---|---|
| TW | 201409694 | 3/2014 |
| TW | 201411837 | 3/2014 |
| TW | 201426972 | 7/2014 |
| TW | 201438108 | 10/2014 |

OTHER PUBLICATIONS

"Office Action of Taiwan Counterpart Application", issued on Jul. 15, 2016, p. 1-p. 4, in which the listed references were cited.

* cited by examiner

*Primary Examiner* — Minh-Loan Tran
(74) *Attorney, Agent, or Firm* — J. C. Patents (57) ABSTRACT

Provided is a semiconductor device, including: a substrate, a well region of a first conductivity type, a field region of a second conductivity type, a first doped region of the first conductivity type, and a second doped region of the second conductivity type. The well region is located in the substrate. The field region is located in the well region. The first doped region is located in the well region of a first side of the field region. The second doped region is located in the field region, wherein the first doped region is at least partially surrounded by the second doped region.

19 Claims, 6 Drawing Sheets

HIGH VOLTAGE JUNCTION FIELD EFFECT TRANSISTOR

BACKGROUND OF THE INVENTION

Field of the Invention

The invention relates to a semiconductor device and particularly relates to a high voltage junction field effect transistor (JFET).

Description of Related Art

High voltage devices are extensively used in power management integrated circuits (PMIC), switch mode power supplies (SMPS), and LED drivers. In recent years, green energy technology, which requires higher conversion efficiency and lower standby power consumption, is drawing more and more attention. Generally, a start-up circuit and a pulse width modulation (PWM) circuit are integrated in a switch mode power integrated circuit. The start-up circuit can be used for starting up the pulse width modulation circuit and is turned off when the pulse width modulation circuit is started up and begins to operate. Thus, the start-up circuit needs to have the characteristic of low leakage current.

Compared to the conventional power resistor or high voltage depletion NMOS (HVDNMOS), a high voltage junction field effect transistor (HVJFET) is used as the start-up circuit, which has the characteristics of high pinch off voltage and low leakage current. However, the traditional HVJFET requires a well region so as to pinch off voltage and the well is more sensitive to the process variation. As a result, the pinch off voltage may shift easily.

SUMMARY OF THE INVENTION

The invention provides a semiconductor device with reduced sensitivity to process variation for stabilizing electrical properties.

The invention provides a semiconductor device, including: a substrate, a well region of a first conductivity type, a field region of a second conductivity type, a first doped region of the first conductivity type, and a second doped region of the second conductivity type. The well region is disposed in the substrate. The field region is disposed in the well region. The first doped region is disposed in the well region on a first side of the field region. The second doped region is disposed in the field region, wherein the second doped region at least partially surrounds the first doped region.

In an embodiment of the invention, the field region and the second doped region overlap each other, and the field region surrounds the second doped region.

In an embodiment of the invention, the second doped region further extends to surround the first doped region.

In an embodiment of the invention, the second doped region is one doped region or includes a plurality of doped regions.

In an embodiment of the invention, the second doped region includes a plurality of doped regions. The doped regions are arranged symmetrically or asymmetrically with respect to the first doped region.

In an embodiment of the invention, the semiconductor device further includes: a third doped region of the first conductivity type, a first top doped region of the second conductivity type, a plurality of second top doped regions of the second conductivity type, and a fourth doped region of the second conductivity type. The third doped region is disposed in the well region on a second side of the field region. The field region is disposed between the first doped region and the third doped region. The first top doped region is disposed between the third doped region and the second doped region. The second top doped regions are disposed in the well region between the field region and the first doped region. The fourth doped region is disposed in the substrate on the second side of the field region. The third doped region is disposed between the first top doped region and the fourth doped region.

In an embodiment of the invention, the first top doped region and the third doped region partially overlap each other.

In an embodiment of the invention, the first doped region is annular, and the second top doped regions surround the first doped region.

In an embodiment of the invention, the first doped region is a drain, the second doped region is a gate, the third doped region is a source, and the fourth doped region is a base gate.

The invention provides a semiconductor device, including: a substrate of a second conductivity type, a first well region of a first conductivity type, a first field region of the second conductivity type, a first doped region of the first conductivity type, a second doped region of the second conductivity type, a third doped region of the first conductivity type, a first top doped region of the second conductivity type, and a first insertion layer of the first conductivity type. The first well region is disposed in the substrate. The first field region is disposed in the first well region. The first doped region is disposed in the first well region on a first side of the first field region. The second doped region is disposed in the first field region. The third doped region is disposed in the first well region on a second side of the first field region. The second doped region is disposed between the first doped region and the third doped region. The first top doped region is disposed in the first well region under the first field region. The first insertion layer is disposed above a portion of the first field region. The portion of the first field region is disposed between the first insertion layer and the first top doped region.

In an embodiment of the invention, the first field region, the first top doped region and the first insertion layer, and the third doped region partially overlap one another.

In an embodiment of the invention, the first field region surrounds the second doped region, and the first field region and the second doped region overlap each other.

In an embodiment of the invention, the semiconductor device further includes: an isolation structure, a second top doped region of the second conductivity type, and a second insertion layer of the first conductivity type. The isolation structure is disposed between the first doped region and the second doped region. The second top doped region is disposed in the first well region under the isolation structure. The second insertion layer is disposed between the isolation structure and the second top doped region.

In an embodiment of the invention, the isolation structure includes a field oxide structure, a shallow trench isolation structure, a deep trench isolation structure, or a combination of the foregoing.

In an embodiment of the invention, the semiconductor device further includes: a second well region of the second conductivity type, a second field region of the second conductivity type, and a fourth doped region of the second conductivity type. The second well region is disposed in the substrate on the second side of the first field region. The second field region is disposed in the second well region. The fourth doped region is disposed in the second field region.

In an embodiment of the invention, a distance exists between the first field region and the second field region. A length of the distance is in a range of 1 μm to 18 μm.

In an embodiment of the invention, the first doped region is a drain, the second doped region is a gate, the third doped region is a source, and the fourth doped region is a base gate.

In an embodiment of the invention, the first well region includes a deep well region, a drift layer, a buffer layer, or a combination of the foregoing.

In an embodiment of the invention, the substrate includes an epitaxial layer, a non-epitaxial layer, a silicon on insulator substrate, or a combination of the foregoing.

In an embodiment of the invention, the semiconductor device further includes a buried layer of the first conductivity type disposed between the first well region and the substrate.

Based on the above, the invention replaces the well region of the conventional HVJFET with the first field region and the first top doped region having a shallower doping depth, so as to reduce the sensitivity of the HVJFET to the process variation. Moreover, because the first field region and the first top doped region and the third doped region (the source, for example) partially overlap one another, the first field region and the first top doped region may serve as the pinch off channel under the source for stabilizing the electrical properties. In addition, the invention includes one or more second doped regions (the gate, for example) to at least partially surround the first doped region (the drain, for example) so as to adjust the drain current.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

In the following embodiments, if a first conductivity type is N-type, a second conductivity type is P-type; and if the first conductivity type is P-type, the second conductivity type is N-type. A P-type dopant is boron, for example; and an N-type dopant is phosphorus or arsenic, for example. In this embodiment, the first conductivity type is N-type and the second conductivity type is P-type, for example. However, it should be noted that the invention is not limited thereto. Hereinafter, the same or similar reference numerals represent the same or similar elements.

Figure 1:
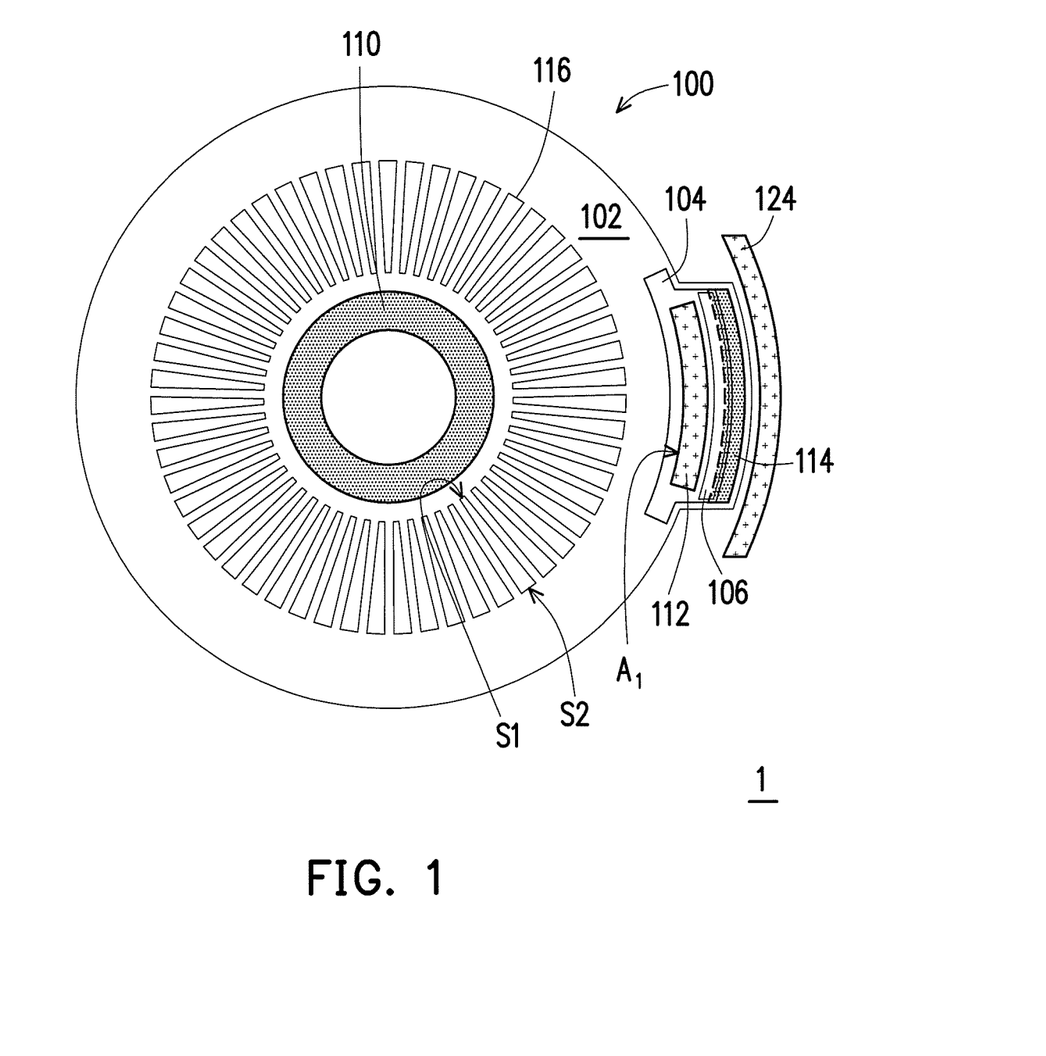
FIG. 1 is a schematic top view of a semiconductor device according to the first embodiment of the invention.

FIG. 1 is a schematic top view of a semiconductor device according to the first embodiment of the invention.

With reference to FIG. 1, the invention provides a semiconductor device 1, which includes: a substrate 100, a well region 102 of a first conductivity type, a plurality of top doped regions 116 of a second conductivity type, a first doped region 110 of the first conductivity type, a field region 104 of the second conductivity type, and a second doped region 112 of the second conductivity type. The substrate 100 is a semiconductor substrate of the first conductivity type, e.g., a P-type substrate, for example. A material of the semiconductor substrate is at least one selected from a group consisting of Si, Ge, SiGe, GaP, GaAs, SiC, SiGeC, InAs, and InP, for example. The substrate 100 may also be an EPI layer, a non-EPI layer, a silicon on insulator (SOI) substrate, or a combination of the foregoing, for example.

The well region 102 is located in the substrate 100. Although FIG. 1 illustrates a case where the well region 102 is circle-like, the invention is not limited thereto. In other embodiments, the well region 102 may be circular, elliptical, polygonal, or a combination of the foregoing, for example. The first doped region 110 is located in the well region 102. In an embodiment, the first doped region 110 is annular, for example. The first doped region 110 is disposed in a central position of the well region 102, for example. Nevertheless, it should be noted that the invention is not limited thereto. The top doped regions 116 are located in the well region 102. In an embodiment, the top doped regions 116 are a plurality of strip doped regions, for example. The strip doped regions 116 are distributed radially outward with the first doped region 110 as the center and surround the first doped region 110. The strip doped regions have the same or different intervals therebetween. The top doped regions 116 have a first side S1 (the inner side, for example) and a second side S2 (the outer side, for example). The first doped region 110 is located in the well region 102 on the first side S1 of the top doped regions 116. The field region 104 is located in the well region 102 on the second side S2 of the top doped regions 116.

The second doped region 112 is located in the field region 104. That is, the second doped region 112 overlaps the field region 104, and the field region 104 surrounds the second doped region 112. FIG. 1 illustrates a case that the field region 104 has a protruding shape on the upper side and the lower side respectively at where the field region 104 overlaps the second doped region 112. However, it should be noted that the invention is not limited thereto. The shape of the field region 104 of the invention may be adjusted as required as long as the field region 104 completely surrounds the second doped region 112.

Figure 2:
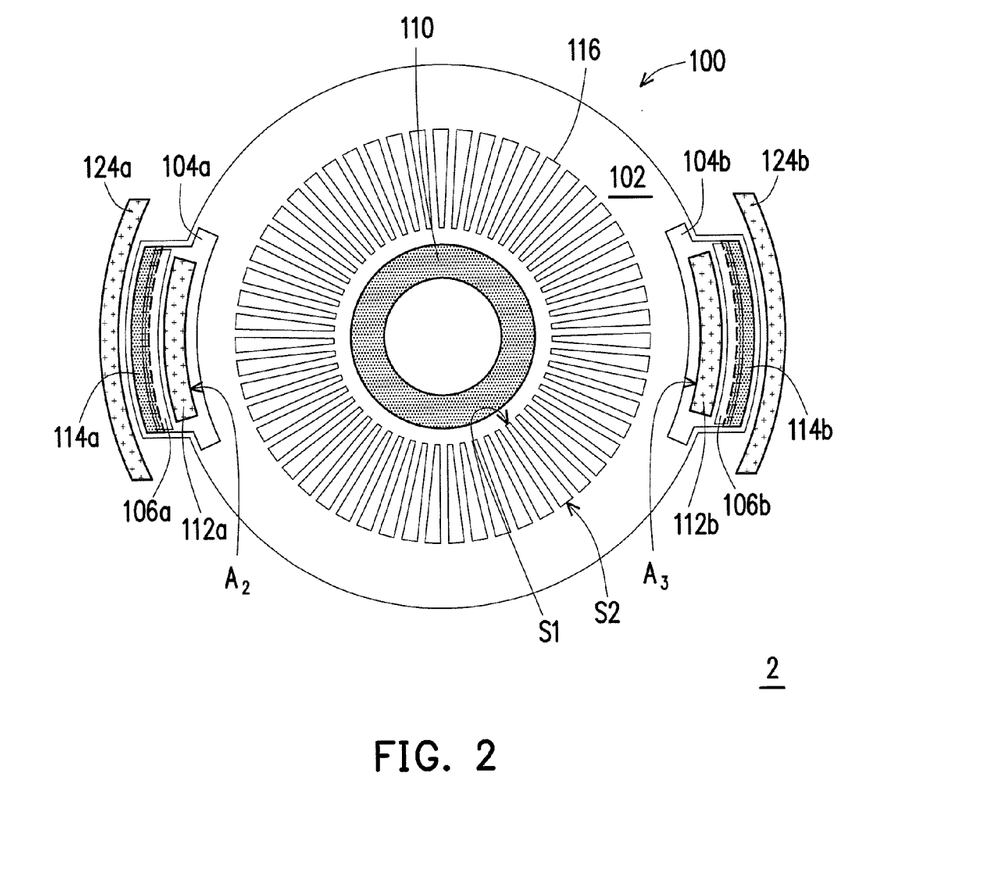
FIG. 2 is a schematic top view of a semiconductor device according to the second embodiment of the invention.

It should be noted that, in some embodiments, the second doped region 112 is curved, for example, and at least a portion thereof surrounds a side of the first doped region 110, as shown in FIG. 1. Nevertheless, the invention is not limited thereto. In other embodiments, the second doped region 112 may be annular, racetrack-shaped, polygonal, or a combination of the foregoing, for example. In an embodiment, the second doped region 112 completely surrounds the first doped region 110. In an embodiment, the second doped region 112 is one single doped region or includes a plurality of doped regions, for example. If the second doped region 112 includes a plurality of doped regions, the doped regions are arranged symmetrically or asymmetrically with respect to the first doped region 110, for example. Specifically, as shown in FIG. 2, second doped regions 112a and 112b are arranged symmetrically with the first doped region 110 as the center. Nevertheless, the invention is not limited thereto. In other embodiments, the second doped regions 112a and 112b are arranged asymmetrically with respect to the first doped region 110. Since the second doped region 112 at least partially surrounds the first doped region 110, in this embodiment, a drain current is adjustable by changing the size of the second doped region 112 (namely, an area $A_1$ of the second doped region 112 corresponding to the first doped region 110). For example, the drain current increases as the area $A_1$ of the second doped region 112 corresponding to the first doped region 110 increases.

Moreover, in some embodiments, the semiconductor device 1 further includes: a third doped region 114 of the first conductivity type, a top doped region 106 of the second conductivity type, and a fourth doped region 124 of the second conductivity type. The third doped region 114 is located in the well region 102 on the second side S2 of the top doped regions 116, wherein the second doped region 112 is located between the top doped regions 116 and the third doped region 114. The top doped region 106 is located between the third doped region 114 and the second doped region 112. The top doped region 106 partially overlaps the third doped region 114. The fourth doped region 124 is located in the substrate 100 on the second side S2 of the top doped regions 116. The third doped region 114 is located between the top doped region 106 and the fourth doped region 124. The fourth doped region 124 surrounds the third doped region 114. In an embodiment, the first doped region 110 is a drain, the second doped region 112 is a gate, the third doped region 114 is a source, and the fourth doped region 124 is a base gate, for example. Because the field region 104 and the top doped region 106 partially overlap the third doped region 114 (the source, for example), the field region 104 and the top doped region 106 may serve as a pinch off channel under the source for stabilizing the electrical properties.

FIG. 2 is a schematic top view of a semiconductor device according to the second embodiment of the invention.

With reference to FIG. 1 and FIG. 2, a semiconductor device 2 of the second embodiment is similar to the semiconductor device 1 of the first embodiment of the invention, and a difference therebetween lies in that: the semiconductor device 2 of the second embodiment includes two field regions 104a and 104b, two second doped regions 112a and 112b, two third doped regions 114a and 114b, two top doped regions 106a and 106b, and two fourth doped regions 124a and 124b. In FIG. 2, the field regions 104a and 104b, the second doped regions 112a and 112b, the third doped regions 114a and 114b, the top doped regions 106a and 106b, and the fourth doped regions 124a and 124b are arranged symmetrically with respect to the first doped region 110. Nevertheless, the invention is not limited thereto. In other embodiments, the foregoing doped regions are arranged asymmetrically with respect to the first doped region 110. In addition, the second doped regions 112a and 112b in FIG. 2 respectively have an area $A_2$ and an area $A_3$ corresponding to the first doped region 110. A sum of the area $A_2$ and the area $A_3$ in FIG. 2 is larger than the area $A_1$ in FIG. 1. Therefore, the semiconductor device 2 of FIG. 2 has a larger drain current.

Figure 3:
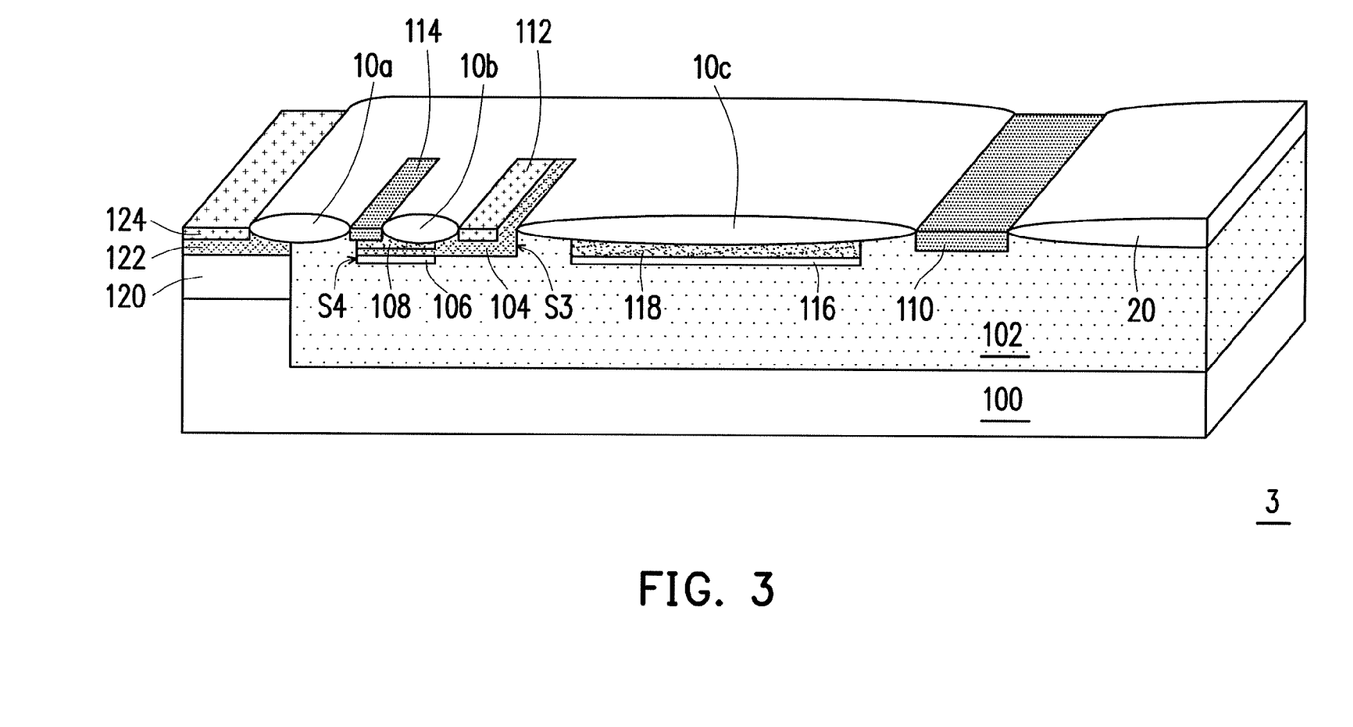
FIG. 3 is a perspective cross-sectional view of a semiconductor device according to the third embodiment of the invention.
Figure 4:
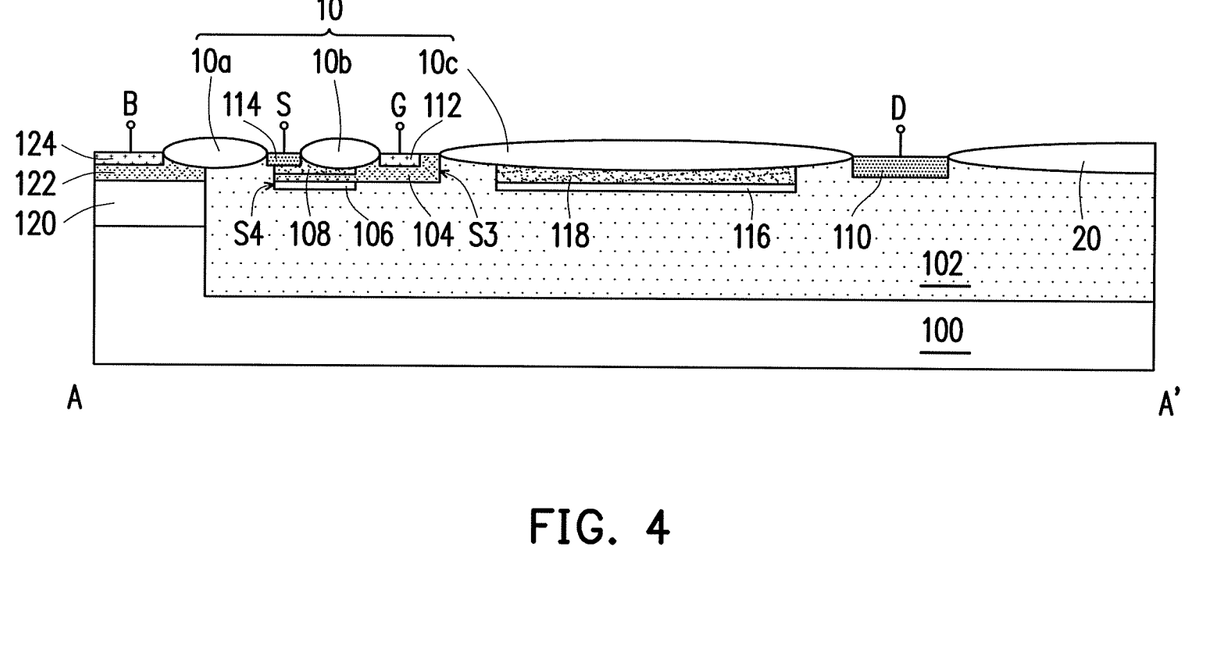
FIG. 4 is a schematic cross-sectional view along the line A-A' of FIG. 3.
Figure 5:
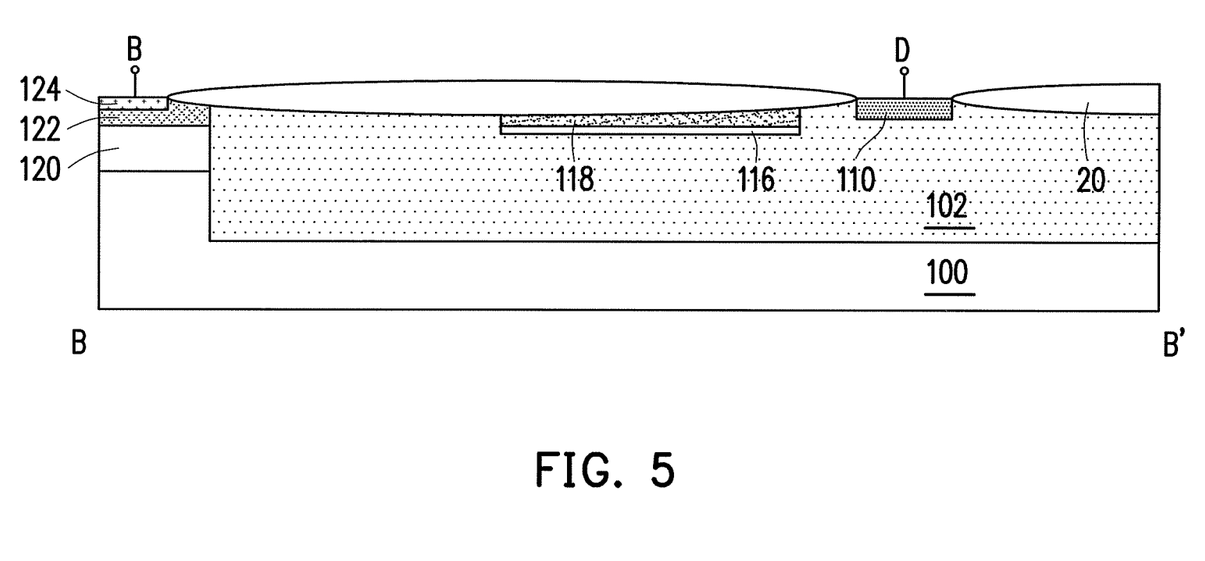
FIG. 5 is a schematic cross-sectional view along the line B-B' of FIG. 3.

FIG. 3 is a perspective cross-sectional view of a semiconductor device according to the third embodiment of the invention. FIG. 4 is a schematic cross-sectional view along the line A-A' of FIG. 3. FIG. 5 is a schematic cross-sectional view along the line B-B' of FIG. 3.

With reference to FIG. 3, FIG. 4, and FIG. 5, the invention provides a semiconductor device 3, which includes: a substrate 100 of a second conductivity type, a well region 102 of a first conductivity type, a field region 104 of the second conductivity type, a first doped region 110 of the first conductivity type, a second doped region 112 of the second conductivity type, a third doped region 114 of the first conductivity type, a top doped region 106 of the second conductivity type, and an insertion layer 108 of the first conductivity type. The material of the substrate 100 has been specified in the above embodiment and thus is not repeated hereinafter.

The well region 102 is located in the substrate 100. In an embodiment, a dopant implanted into the well region 102 is phosphorus or arsenic, and a doping concentration thereof is in a range of $8\times10^{13}/cm^3$ to $8\times10^{16}/cm^3$, for example. In an embodiment, the well region 102 is a deep well region, a drift layer, a buffer layer, or a combination of the foregoing, for example. The field region 104 is located in the well region 102. In an embodiment, a dopant implanted into the field region 104 is boron, and a doping concentration thereof is in a range of $4\times10^{14}/cm^3$ to $8\times10^{17}/cm^3$ and a doping depth thereof is in a range of 0.4 μm to 1.8 μm, for example.

The first doped region 110 is located in the well region 102 on a first side S3 of the field region 104. In an embodiment, a dopant implanted into the first doped region 110 is phosphorus or arsenic, and a doping concentration thereof is in a range of $8\times10^{16}/cm^3$ to $8\times10^{19}/cm^3$, for example. The third doped region 114 is located in the well region 102 on a second side S4 of the field region 104. In an embodiment, a dopant implanted into the third doped region 114 is phosphorus or arsenic, and a doping concentration thereof is in a range of $8\times10^{16}/cm^3$ to $8\times10^{19}/cm^3$, for example. The second doped region 112 is located between the first doped region 110 and the third doped region 114 and located in the field region 104. Specifically, the second doped region 112 overlaps the field region 104, and the second doped region 112 is surrounded by the field region 104. In an embodiment, a dopant implanted into the second doped region 112 is boron, and a doping concentration thereof is in a range of $8\times10^{16}/cm^3$ to $8\times10^{19}/cm^3$, for example.

In an embodiment, the top doped region 106 and the insertion layer 108 may be optionally formed. In other words, a semiconductor device not including the top doped region 106 and the insertion layer 108 also falls within the scope of the invention. The field region 104, the top doped region 106 and the insertion layer 108 partially overlap the third doped region 114 and the field region 104, the top doped region 106 and the insertion layer 108 are located in the well region 102. More specifically, the top doped region 106 is located under a portion of the field region 104. In an embodiment, the top doped region 106 may also extend under the second doped region 112. In an embodiment, a dopant implanted into the top doped region 106 is boron, and a doping concentration thereof is in a range of $1\times10^{14}/cm^3$ to $8\times10^{17}/cm^3$ and a doping depth thereof is in a range of 0.4 μm to 1.8 μm, for example. The insertion layer 108 is located above a portion of the field region 104. A portion of the field region 104 is located between the insertion layer 108 and the top doped region 106. In an embodiment, a dopant implanted into the insertion layer 108 is phosphorus or arsenic, and a doping concentration thereof is in a range of $2\times10^{14}/cm^3$ to $2\times10^{17}/cm^3$ and a doping depth thereof is in a range of 0.3 μm to 1.2 μm, for example. In an embodiment, the first doped region 110 is a drain D, the second doped region 112 is a gate G, the third doped region 114 is a source S, and the fourth doped region 124 is a base gate B, for example.

It should be noted that because the field region 104 and the top doped region 106 partially overlap the third doped region 114 (the source S, for example), the field region 104 and the top doped region 106 may serve as the pinch off channel under the source for stabilizing the electrical properties. Moreover, the insertion layer 108 and the third doped region 114 (the source S, for example) also partially overlap and are in contact with each other. Therefore, the drain current is allowed to flow through the insertion layer 108 (the current channel, for example) having a shallower doping depth. Since the insertion layer 108 has the shallower doping depth, the insertion layer 108 is less likely to be affected by the process variation (the drive in temperature or ion implantation process, for example) in comparison with the well region that has a deeper doping depth. Thereby, the invention prevents the pinch off voltage from shifting due to the process variation.

Moreover, in some embodiments, the semiconductor device 3 further includes: isolation structures 10 and 20, a top doped region 116 of the second conductivity type, an insertion layer 118 of the first conductivity type, a well region 120 of the second conductivity type, a field region 122 of the second conductivity type, and a fourth doped region 124 of the second conductivity type. The isolation structure 10 includes isolation structures 10a, 10b, and 10c. As shown in FIG. 4, the isolation structure 10a is located between the fourth doped region 124 and the third doped region 114. The isolation structure 10b is located between the third doped region 114 and the second doped region 112. The isolation structure 10c is located between the second doped region 112 and the first doped region 110. As shown in FIG. 5, the isolation structures 10a, 10b, and 10c may be deemed as one single isolation structure located between the fourth doped region 124 and the first doped region 110. The isolation structure 20 is located on the well region 102 on the other side of the first doped region 110 opposite to the isolation structure 10c. A material of the isolation structures 10 and 20 includes a doped or undoped silicon oxide, a low stress silicon nitride, a silicon oxynitride, or a combination of the foregoing, and a forming method of the isolation structures 10 and 20 includes local thermal oxidation (LOCOS), shallow trench isolation, or deep trench isolation, for example. In an embodiment, the isolation structures 10 and 20 may be field oxide (FOX) structures, shallow trench isolation (STI) structures, deep trench isolation (DTI) structures, or a combination of the foregoing, for example.

The top doped region 116 is located in the well region 102 under the isolation structure 10c. The top doped region 116 has an effect of reduced surface field (RESURF), thereby improving the breakdown voltage of the semiconductor device 3. In an embodiment, a dopant implanted into the top doped region 116 is boron, and a doping concentration thereof is in a range of $1\times10^{14}/cm^3$ to $8\times10^{17}/cm^3$, for example. The insertion layer 118 is located between the isolation structure 10c and the top doped region 116. The insertion layer 118 may serve as another current channel for reducing the ON resistance of the semiconductor device 3. In an embodiment, a dopant implanted into the insertion layer 118 is phosphorus or arsenic, and a doping concentration thereof is in a range of $2\times10^{14}/cm^3$ to $2\times10^{17}/cm^3$, for example. In an embodiment, the top doped region 116 and the insertion layer 118 may be optionally formed. In other words, a semiconductor device not including the top doped region 116 and the insertion layer 118 also falls within the scope of the invention.

In addition, the well region 120 is located in the substrate 100 on the second side S4 of the field region 104. In an embodiment, a dopant implanted into the well region 120 is boron, and a doping concentration thereof is in a range of $8\times10^{14}/cm^3$ to $4\times10^{17}/cm^3$, for example. The field region 122 is located in the well region 120. In an embodiment, a dopant implanted into the field region 122 is boron, and a doping concentration thereof is in a range of $4\times10^{14}/cm^3$ to $8\times10^{17}/cm^3$ and a doping depth thereof is in a range of 0.4 μm to 1.8 μm, for example. The fourth doped region 124 is located in the field region 122. In an embodiment, a dopant implanted into the fourth doped region 124 is boron, and a doping concentration thereof is in a range of $8\times10^{16}/cm^3$ to $8\times10^{19}/cm^3$, for example. It should be noted that a distance exists between the field region 104 and the field region 122. In an embodiment, a length L of the distance is in a range of 1 μm to 18 μm, for example. In this embodiment, the pinch off voltage is adjustable by changing the length L of the distance.

Figure 6:
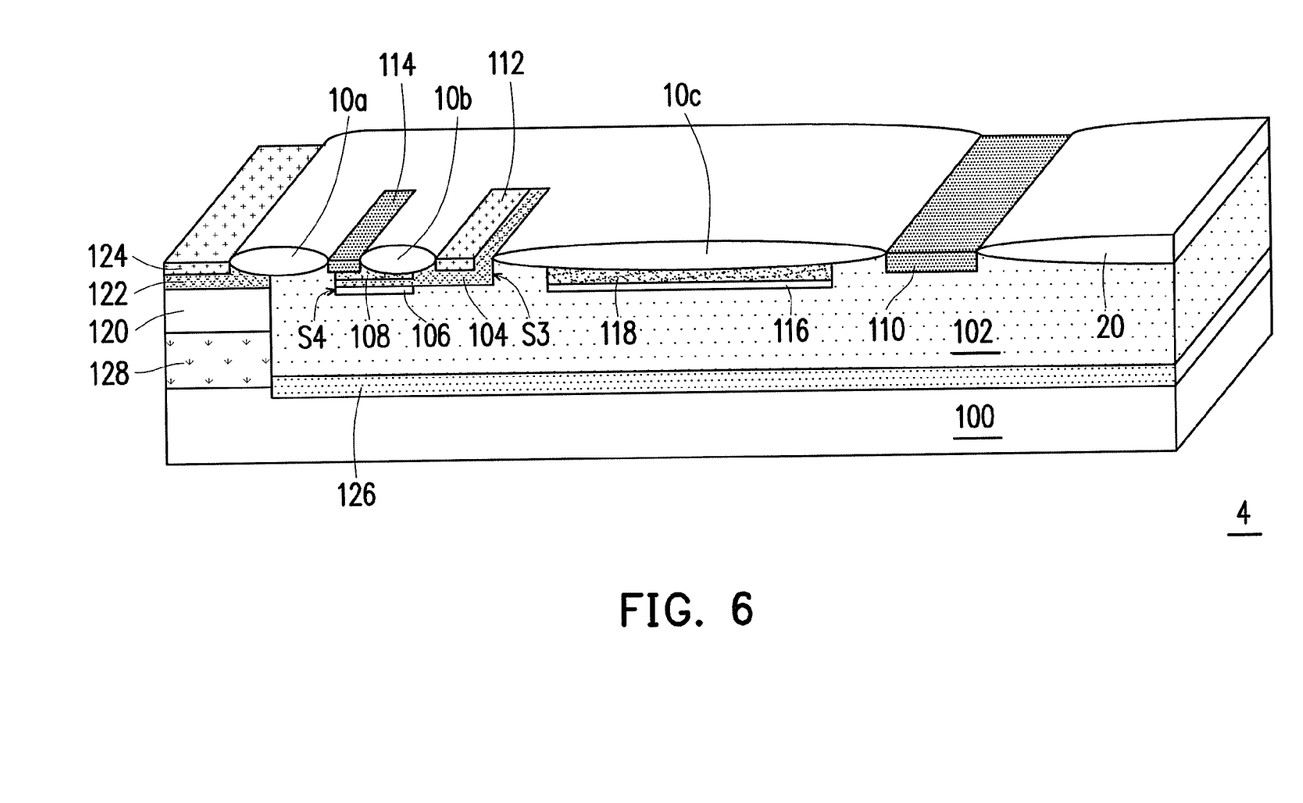
FIG. 6 is a perspective cross-sectional view of a semiconductor device according to the fourth embodiment of the invention.

FIG. 6 is a perspective cross-sectional view of a semiconductor device according to the fourth embodiment of the invention.

With reference to FIG. 3 and FIG. 6, a semiconductor device 4 of the fourth embodiment is similar to the semiconductor device 3 of the third embodiment of the invention, and a difference therebetween lies in that: the semiconductor device 4 of the fourth embodiment includes an buried layer 126 of the first conductivity type and an epitaxial layer 128 of the second conductivity type. The buried layer 126 is located between the well region 102 and the substrate 100. In an embodiment, a dopant implanted into the buried layer 126 is phosphorus or arsenic, and a doping concentration thereof is in a range of $8\times10^{15}/cm^3$ to $8\times10^{18}/cm^3$, for example. The epitaxial layer 128 is located between the well region 120 and the substrate 100. In an embodiment, a dopant implanted into the epitaxial layer 128 is boron, and a doping concentration thereof is in a range of $8\times10^{13}/cm^3$ to $8\times10^{15}/cm^3$, for example.

To sum up, the invention replaces the well region of the conventional HVJFET with the first field region and the first top doped region having a shallower doping depth, so as to reduce the sensitivity of the HVJFET to the process variation. Moreover, because the first field region and the first top doped region and the third doped region (the source, for example) partially overlap one another, the first field region and the first top doped region may serve as the pinch off channel under the source for stabilizing the electrical properties. In addition, the invention includes one or more second doped regions (the gate, for example) to at least partially surround the first doped region (the drain, for example) so as to adjust the drain current.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. A semiconductor device, comprising:
    a well region of a first conductivity type disposed in a substrate;
    a field region of a second conductivity type disposed in the well region;

a first doped region of the first conductivity type disposed in the well region on a first side of the field region;

a second doped region of the second conductivity type disposed in the field region, wherein the second doped region at least partially surrounds the first doped region;

a third doped region of the first conductivity type disposed in the well region on a second side of the field region, wherein the field region is disposed between the first doped region and the third doped region;

a first top doped region of the second conductivity type disposed between the third doped region and the second doped region;

a plurality of second top doped regions of the second conductivity type disposed in the well region between the field region and the first doped region; and a fourth doped region of the second conductivity type disposed in the substrate on the second side of the field region, wherein the third doped region is disposed between the first top doped region and the fourth doped region.

2. The semiconductor device according to claim 1, wherein the field region and the second doped region overlap each other, and the field region surrounds the second doped region.

3. The semiconductor device according to claim 1, wherein the second doped region further extends to surround the first doped region.

4. The semiconductor device according to claim 1, wherein the second doped region is one doped region or comprises a plurality of doped regions.

5. The semiconductor device according to claim 1, wherein the second doped region comprises a plurality of doped regions that are arranged symmetrically or asymmetrically with respect to the first doped region.

6. The semiconductor device according to claim 1, wherein the first top doped region and the third doped region partially overlap each other.

7. The semiconductor device according to claim 1, wherein the first doped region is a drain, the second doped region is a gate, the third doped region is a source, and the fourth doped region is a base gate.

8. The semiconductor device according to claim 1, wherein the first doped region is annular, and the second top doped regions surround the first doped region.

9. A semiconductor device, comprising:
a first well region of a first conductivity type disposed in a substrate of a second conductivity type;
a first field region of the second conductivity type disposed in the first well region;
a first doped region of the first conductivity type disposed in the first well region on a first side of the first field region;
a second doped region of the second conductivity type disposed in the first field region;
a third doped region of the first conductivity type disposed in the first well region on a second side of the first field region, wherein the second doped region is disposed between the first doped region and the third doped region;
a first top doped region of the second conductivity type disposed in the first well region under the first field region; and
a first insertion layer of the first conductivity type disposed above a portion of the first field region, wherein the portion of the first field region is disposed between the first insertion layer and the first top doped region.

10. The semiconductor device according to claim 9, wherein the first field region, the first top doped region and the first insertion layer, and the third doped region partially overlap one another.

11. The semiconductor device according to claim 9, wherein the first field region surrounds the second doped region, and the first field region and the second doped region overlap each other.

12. The semiconductor device according to claim 9, further comprising:
an isolation structure disposed between the first doped region and the second doped region;
a second top doped region of the second conductivity type disposed in the first well region under the isolation structure; and
a second insertion layer of the first conductivity type disposed between the isolation structure and the second top doped region.

13. The semiconductor device according to claim 12, wherein the isolation structure comprises a field oxide structure, a shallow trench isolation structure, a deep trench isolation structure, or a combination of the foregoing.

14. The semiconductor device according to claim 9, further comprising:
a second well region of the second conductivity type disposed in the substrate on the second side of the first field region;
a second field region of the second conductivity type disposed in the second well region; and
a fourth doped region of the second conductivity type disposed in the second field region.

15. The semiconductor device according to claim 14, wherein a distance exists between the first field region and the second field region, and a length of the distance is in a range of 1 μm to 18 μm.

16. The semiconductor device according to claim 14, wherein the first doped region is a drain, the second doped region is a gate, the third doped region is a source, and the fourth doped region is a base gate.

17. The semiconductor device according to claim 9, wherein the first well region comprises a deep well region, a drift layer, a buffer layer, or a combination of the foregoing.

18. The semiconductor device according to claim 9, wherein the substrate comprises an epitaxial layer, a non-epitaxial layer, a silicon on insulator substrate, or a combination of the foregoing.

19. The semiconductor device according to claim 9, further comprising an buried layer of the first conductivity type disposed between the first well region and the substrate.

* * * * *